United States Patent [19]

Tojo et al.

[11] Patent Number: 4,532,423
[45] Date of Patent: Jul. 30, 1985

[54] IC TESTER USING AN ELECTRON BEAM CAPABLE OF EASILY SETTING A PROBE CARD UNIT FOR WAFERS & PACKAGED IC'S TO BE TESTED

[75] Inventors: Toru Tojo, Yamato; Kazuyoshi Sugihara, Kawasaki, both of Japan

[73] Assignee: Tokyo Shibaura Denki Kabushiki Kaisha, Kawasaki, Japan

[21] Appl. No.: 495,486

[22] Filed: May 17, 1983

[30] Foreign Application Priority Data

May 31, 1982 [JP] Japan ................... 57-92919

[51] Int. Cl.³ .................. G01R 31/02; G01R 31/26; G01N 23/00
[52] U.S. Cl. .................. 250/310; 324/158 F
[58] Field of Search ............ 250/310; 324/158 P, 324/158 F

[56] References Cited

U.S. PATENT DOCUMENTS 4,038,599  7/1977  Bove et al. ............... 324/158 P
4,183,609  1/1980  Luna ....................... 324/158 F

OTHER PUBLICATIONS

P. Fazekas, H. Lindner, R. Lindner, J. Otto and E. Wolfgang, "On-Wafer Defect Classification of LSI-Circuits Using a Modified SEM", Scanning Electron Microscopy, vol. I, SEM Inc., AMF O'Hare, IL 60666.

Electronics International, vol. 54, No. 14, Jul. 1981, pp. 105-112, New York, U.S.A.
Siemens Forschungs-und Entwicklungsberichte, vol. 6, No. 1, 1977, pp. 39-46.
IBM Technical Disclosure Bulletin, vol. 23, No. 7A, Dec. 1980, pp. 2803-2804, New York, U.S.A.

*Primary Examiner*—Bruce C. Anderson
*Attorney, Agent, or Firm*—Oblon, Fisher, Spivak, McClelland & Maier

[57] ABSTRACT

An IC tester including a specimen chamber and an electron optical column for radiating an electron beam to a specimen placed in the specimen chamber, wherein a fixed table is attached to a Z table in the specimen chamber and includes downwardly protruding spring contact pins which are connected to lead wires led outside of the specimen chamber. A probe card unit for testing an IC wafer is provided on the upper surface of the fixed table and includes electric terminals having the same positional relation as that of the spring contact pins. A probe card unit fixing mechanism is attached to the undersurface of the fixed table and is so arranged that the probe card unit can be slid laterally along the undersurface of the fixed table and then upward to press the probe card unit against the undersurface of the fixed table and to bring the spring contact pins into electrical contact with their corresponding probe card terminals.

12 Claims, 15 Drawing Figures

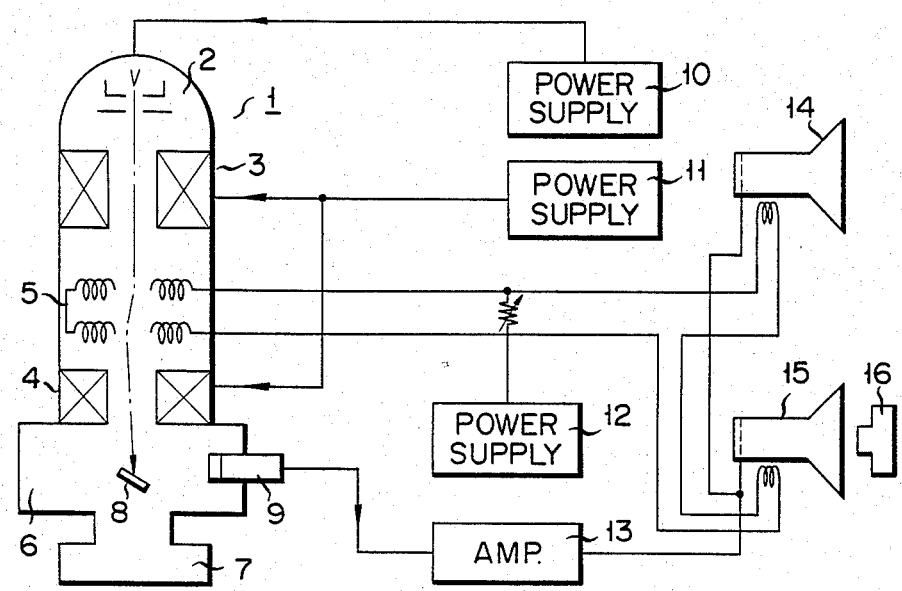
FIG. 1
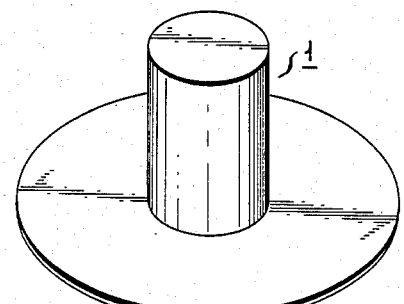
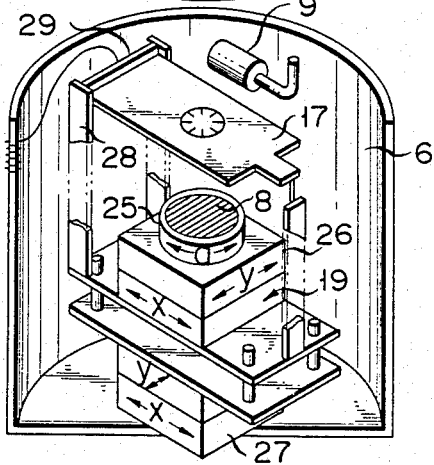
FIG. 2

IC TESTER USING AN ELECTRON BEAM CAPABLE OF EASILY SETTING A PROBE CARD UNIT FOR WAFERS & PACKAGED IC'S TO BE TESTED

BACKGROUND OF THE INVENTION

This invention relates to an IC tester using an electron beam, adapted for testing semiconductor integrated circuits.

In the conventional failure analysis of integrated circuits (ICs) and large scale integrated circuits (LSI), a thin probe connected to an oscilloscope is placed on a desired position of an IC for waveform observation. However, this method involves technical difficulties in testing specimens with high integration density and high operating speed. This is because the space resolution cannot be enhanced over the size of the probe, and the time response is restricted due to the capacitance and inductance of the probe.

As a solution to these problems, an IC tester using an electron beam (hereinafter referred to as EB tester) has been recently developed. The EB tester has a space resolution of submicrons possessed by the electron beam and a time resolution of picoseconds. Accordingly, these testers can perform the failure analysis based on waveform observation as well as the detection of a disconnection in the wiring in LSI's.

FIG. 1 is a schematic illustrating the principle of the EB tester which is described in an article entitled "Fault-Diagnosis & Failure-Analysis Techniques for IC Based on Stroboscopic SEM Method" in a Japanese technical journal, Electronic Materials, vol. 2, 1981. In FIG. 1, reference numeral 1 designates an electron optical column which comprises an electron gun 2, electron lenses 3 and 4, and a scanning coil 5. There are also shown a specimen chamber 6, an exhaust pump 7, a specimen (IC) 8, a scintillation counter 9, an electron-beam accelerating power supply 10, an electron-lens power supply 11, a scanning-coil power supply 12, a signal amplifier 13, a cathode-ray tubes 14 and 15, and a camera 16.

In this EB tester, an electron beam having a diameter of 0.01 to 0.1 microns is radiated to IC 8, and the response of secondary electrons thus emitted is indicated on cathode-ray tubes 14 and 15 to perform the fault diagnosis and failure analysis. More specifically, the failure analysis is achieved by detecting the secondary electrons from IC 8 by means of scintillation counter 9 with probes 18 of a probe card 17 kept in contact with input and output terminals of IC 8, as shown in FIG. 3. In FIG. 3, reference numerals 20 and 21 designate focusing lenses and an electron collector, respectively.

As shown in FIG. 4, the probe card 17 is formed of an insulating plate 22, which has a through hole 23 in the center for the passage of electron beams, probes 18 arranged on the periphery of hole 23, and electrical terminals 24 connected to probes 18.

Referring now to FIG. 2, there will be described the structure of specimen chamber 6. A specimen 8 such as a wafer is set on a specimen table 19. The specimen table 19 consists of a $\theta$ table 25 rotating in a plane perpendicular to the direction of electron beam irradiation, and upper and lower X-Y tables 26 and 27 each moving in X- and Y-directions in a plane perpendicular to the electron-beam irradiating direction, whereby the wafer 8 is positioned relatively to the electron beam. Also, the specimen table 19 is provided with a Z table 28 which moves in the direction of electron beam irradiation, i.e., in Z-direction. The Z table 28 is fitted with a connector 29 into which are plugged the electrical terminals 24 of probe card 17. After replacement of specimen 8, the probes are brought into contact with the wafer by the movement of Z table 29 in the Z-direction. The aforesaid tables are driven by motors (not shown) disposed in specimen chamber 6.

In replacing the specimen in this prior art EB tester, the probe card must be disengaged from the connector after removing the electron optical column, so that the downtime of the tester is extended. The probe card must be frequently replaced according to the type and size of specimens and the kind of tests, and must have easy operability because the specimen is tested in vacuum. Since the probe card is inserted into the connector, the probe-card terminals are rubbed against the connector every time the probe card is replaced. Accordingly, the electrical contact is made unreliable by abrasion, with the result that the probe card and the connector cannot be used over a long period of time.

The specimens to be tested include wafers having integrated circuits formed thereon and packaged IC's. The above-mentioned probe card cannot be used for testing the packaged IC's. Therefore, a special holder is required for testing packaged IC's. In this case, the signal cable for the probe card are not available, so that an exclusive signal cable from the holder must be led outside of the specimen chamber. The signal cable has usually a coating of fluorine-containing polymer, which will produce a noticeable amount of gas. The addition of the signal cable for the packaged IC requires greater vacuum pump capacity, resulting in an increase in cost. If the tables move trailing these signal cables, the table drive motors will have load fluctuations, and the signal cables will be reduced in reliability.

Since the table drive motors are located in the specimen chamber, the movement of the tables will cause magnetic fluctuations in the specimen chamber unless the motors are perfectly magnetically shielded. It is difficult, however, to provide perfect magnetic shielding, so that the magnetic fluctuations cannot be avoided. Therefore, the electron beam is influenced by the magnetic fluctuations, and the space resolution, which constitutes an advantage of the stroboscopic SEM method, deteriorates.

SUMMARY OF THE INVENTION

An object of this invention is to provide an IC tester using an electron beam which is capable of easily setting a probe card and making prolonged use thereof.

Another object of the invention is to provide an IC tester using an electron beam which is capable of testing wafers and packaged IC's without using additional signal cables.

Still another object of the invention is to provide an IC tester using an electron beam which is capable of reducing positional errors of the electron beam resulting from the magnetic fluctuation caused by a table drive system.

According to the invention, a probe card unit is formed to have a plurality of electrical terminals arranged in a predetermined positional relation on the top surface thereof to be connected to electrical terminals of a specimen, a Z table in a specimen chamber is fitted with a fixed table provided with a plurality of downwardly protruding spring contact pins which are connected to lead wires led outside of the specimen chamber and arranged in the same positional relation as that of the electrical terminals on the probe card unit, and a probe card unit fixing mechanism is attached to the undersurface of the fixed table.

The fixing mechanism is so designed that the probe card unit can be carried along the undersurface of the fixed table and moved toward the undersurface when it reaches a predetermined position whereby the probe card unit is clamped to the undersurface of the fixed table so that the spring contact pins are brought into contact with their corresponding terminals on the top surface of the probe card unit.

According to this construction, the probe card unit can easily be set by carrying it along the undersurface of the fixed table. Moreover, the probe card unit can be used over a long period of time since the spring contact pins of the fixed table are only pressed against the electrical terminals of the probe card unit.

The specimen may be either a wafer or a packaged IC. The probe card unit for a wafer is provided with probes which are connected to the electrical terminals on the probe card unit and adapted for making contact with terminals of the wafer. The probe card unit for packaged IC may be provided with a socket for the packaged IC, which has terminals connected to the electrical terminals on the probe card unit. Thus, wafers and packaged IC's can be tested without using additional signal cables by separately using those probe card units for wafers and packaged IC's.

At least part of a table drive system (motors) for driving the tables in the specimen chamber is located outside of the specimen chamber, so that the positional error of the electron beam resulting from magnetic fluctuations can be reduced.

BRIEF DESCRIPTION OF THE DRAWINGS

FIG. 1 is a schematic of a prior art EB tester;

FIG. 2 shows the internal structure of a specimen chamber of the EB tester of FIG. 1;

DETAILED DESCRIPTION OF THE PREFERRED EMBODIMENT

Figure 3:
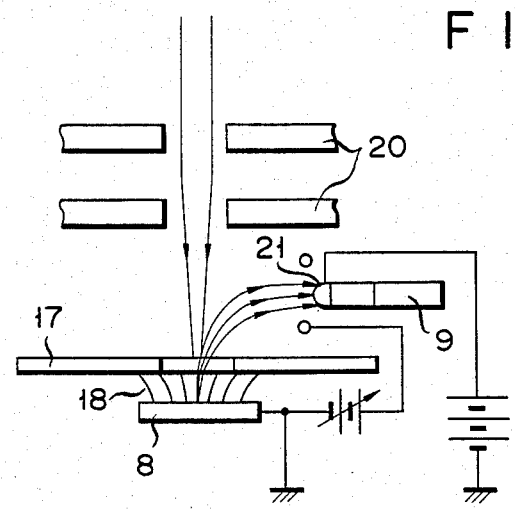
FIG. 3 is a diagram for illustrating the operation of the EB tester.
Figure 4:
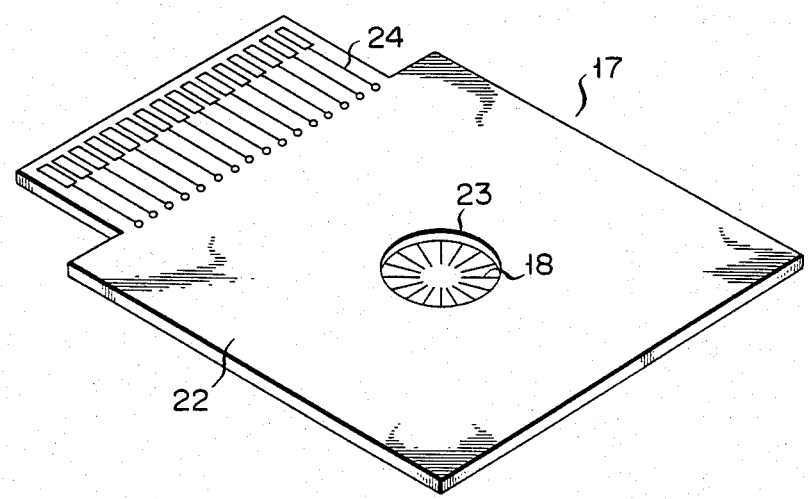
FIG. 4 shows a prior art probe card.
Figure 5:
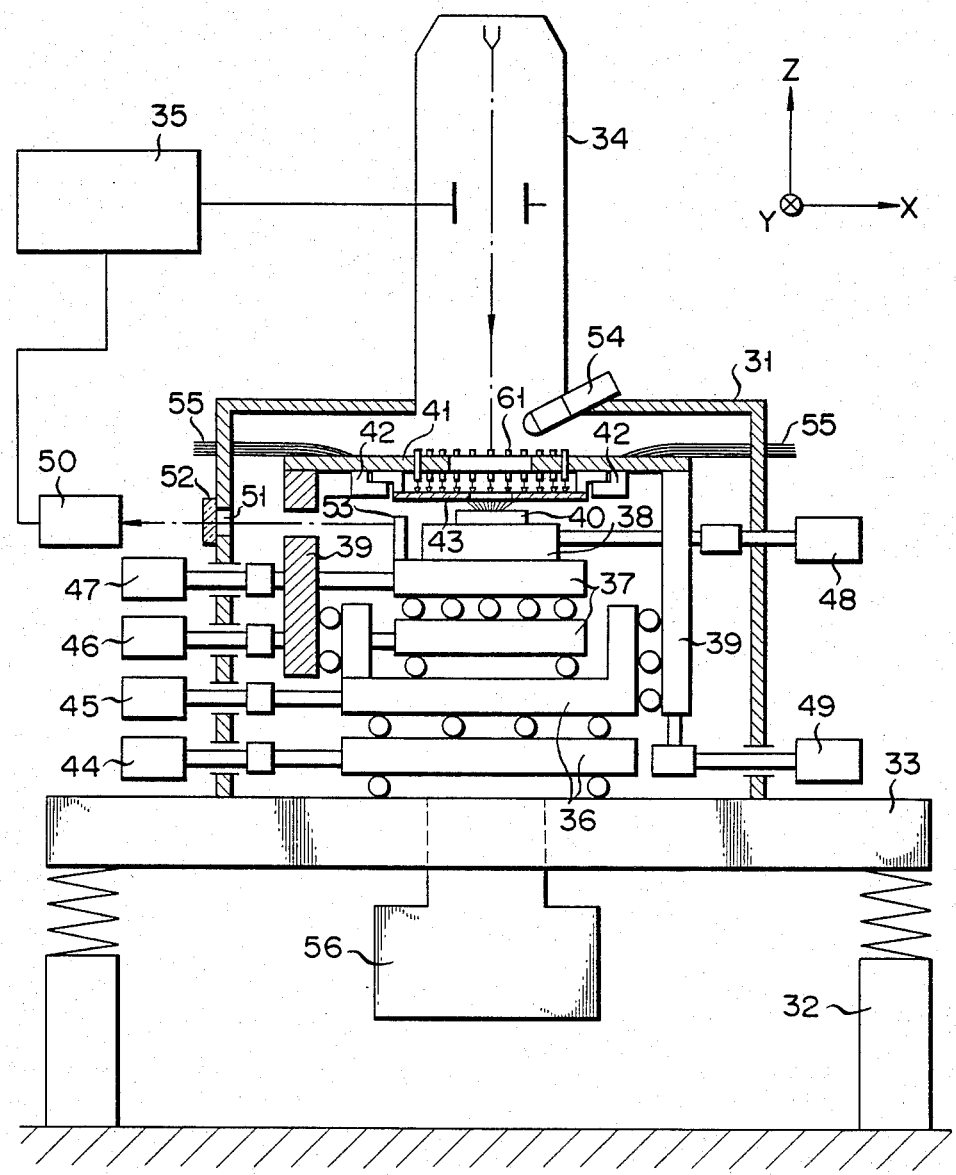
FIG. 5 shows an arrangement of an EB tester embodying this invention.

Referring now to FIG. 5, there will be described an IC tester embodying this invention. In FIG. 5, reference numeral 31 designates a specimen chamber which is fixed on a base 33 on vibration-proof stands 32. An electron optical column 34 is disposed on specimen chamber 31. An electron beam is controlled by a control system 35 including a scanning power supply and the like.

At the bottom portion of specimen chamber 31 lies a lower X-Y table 36 which moves in X- and Y-directions in a plane perpendicular to the direction of electron beam radiation. The lower X-Y table 36 carries thereon an upper X-Y table 37 which is arranged to move by a distance corresponding to the size of a specimen so that the overall surface of the specimen can be measured. On upper X-Y table 37 is placed a θ table 38 which rotates in a plane perpendicular to the direction of electron beam radiation. The θ table 38 carries thereon a cassette 40 which holds a specimen (wafer). The lower X-Y table 36 is fitted with a Z table 39 which moves in the direction electron beam radiation. The Z table 39 is fitted with a fixed table 41 which is provided with fixing mechanism 42 thereunder for holding a probe card unit 43.

The tables 36 to 39 are driven by motors 44 to 49 installed outside the specimen chamber 31. More specifically, lower X-Y table 36 is driven by motors 44 and 45; upper X-Y table 37 by motors 46 and 47, θ table by motor 48, and Z table 39 by motor 49. The motors 44 to 49 are fixed directly to specimen chamber 31 or on a support frame. For example, magnetic fluid seal is used to vacuum seal the drive shafts of the motors. Conventional universal joints or ball splines are used as special power transmission mechanisms between the motors and the tables.

A laser measuring system 50 is disposed on the left-hand side of specimen chamber 31. The laser measuring system 50 applies a laser beam to a reflecting mirror 53 attached to upper X-Y table 37 through a transparent plate 52 covering a through hole 51 of the wall of specimen chamber 31. Receiving a reflected light beam from reflecting mirror 53, laser measuring system 50 detects the position of upper X-Y table 37. The position information of table 37 is transmitted to control system 35 to radiate an electron beam to a desired position on the specimen even if table 37 is misaligned.

Reference numeral 54 designates a scintillation counter, while 55 denotes signal cables. These members are connected to the conventional failure analysis apparatus. Numeral 56 designates a vacuum pump attached to the bottom portion of specimen chamber 31.

Figure 6:
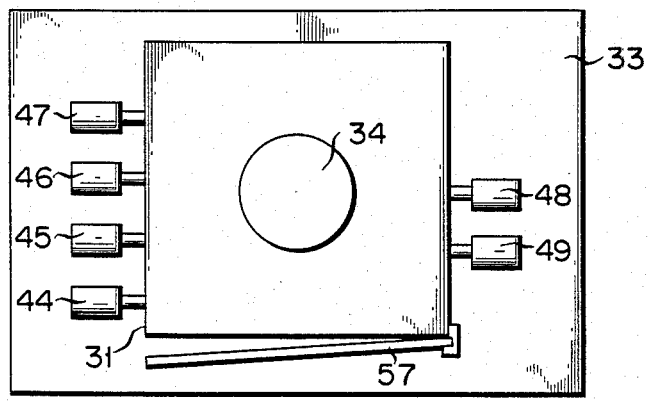
FIG. 6 is a top view of the EB tester of FIG. 5.

As shown in FIG. 6, specimen chamber 31 has a front door 57 through which cassette 40 holding a specimen and/or probe card unit 43 can be set or removed from chamber 31.

Figure 7:
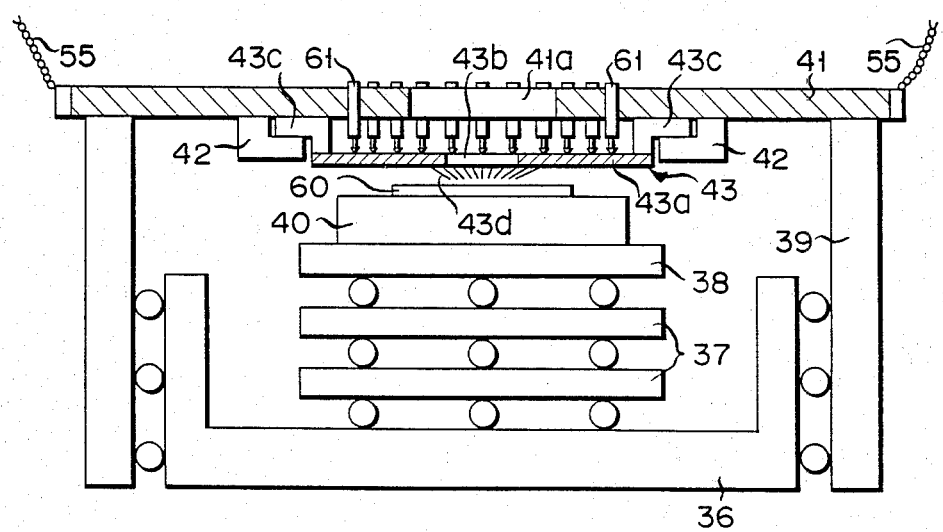
FIG. 7 shows an arrangement of the essential part of the invention including a probe card unit, a probe card unit fixing mechanism, and spring contact pins.

Referring now to FIG. 7, the characteristic construction of this invention will be become more apparent. A plurality of spring contact pins 61 are disposed around an opening 41a of fixed table 41 so as to protrude downward therefrom. The probe card unit 43 has an insulating probe card 43a having an opening 43b at its center through which electron beams and secondary electrons pass. The probe card 43a is screwed to a frame or spacers 43c. A plurality of flexible, thin probes or contact elements 43d are formed along the periphery of opening 43b of probe card 43a. Formed on the upper surface of probe card 43a are electrical terminals around opening 43b which are electrically connected to probes 43d. The spring contact pins 61 are connected to signal cables 55.

The probe card fixing mechanism 42 is so designed as to be manually moved up and down, as described later. For setting probe card unit 43, fixing mechanism 42 is lowered manually, and then the probe card unit 43 is carried into specimen chamber 31 so as to slide on fixing mechanism 42. After probe card unit 43 reaches a predetermined position, fixing mechanism 42 is elevated manually. Thus, the probe card unit 43 is fixed to fixed table 41, as shown in FIG. 7. In this state, the electrical terminals on probe card 43a are brought closely into contact with their corresponding contact pins 61. By lowering Z table 39, the probes 43d of probe card 43a are brought into contact with electrical terminals of a wafer 60 held by cassette 40.

Thus, according to the construction of the invention, the probe card can be inserted and removed very easily, so that the electrical terminals of the probe card connected to probes 43d can be protected against abrasion. Since the table drive motors are disposed outside of specimen chamber 31, the dislocation of electron beam can be reduced to a negligible degree.

Figure 8:
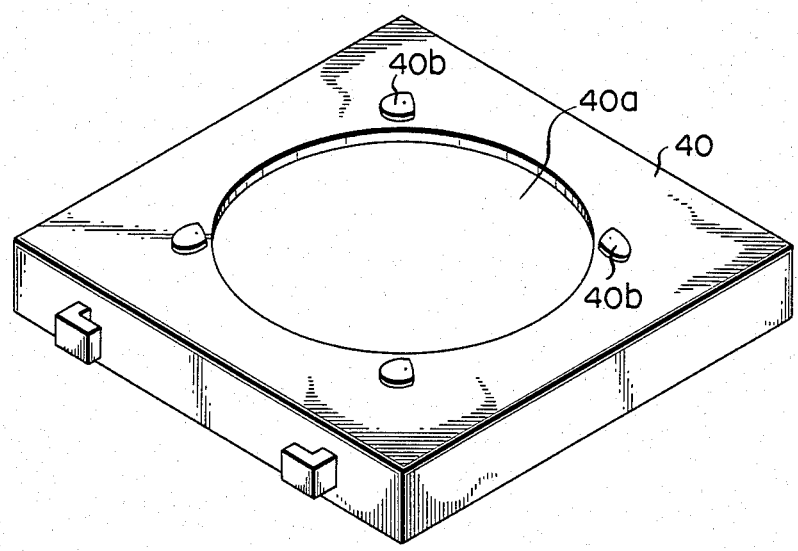
FIG. 8 shows a cassette for supporting a wafer.

FIG. 8 shows cassette 40 for holding a wafer, which is provided with a recess 40a for setting the wafer and retaining members 40b for retaining the wafer.

Figure 9:
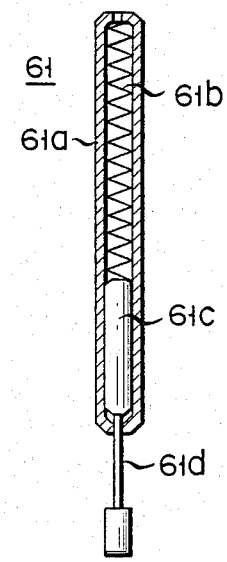
FIG. 9 is a sectional view of a spring contact pin.

FIG. 9 shows the structure of spring contact pins 61, which comprises a cylinder 61a, a rod 61c housed in cylinder 61a, a pin 61d fixed to the end portion of rod 61c, and a spring 61b held in cylinder 61a to press rod 61c so as to protrude pin 61d.

Figure 10:
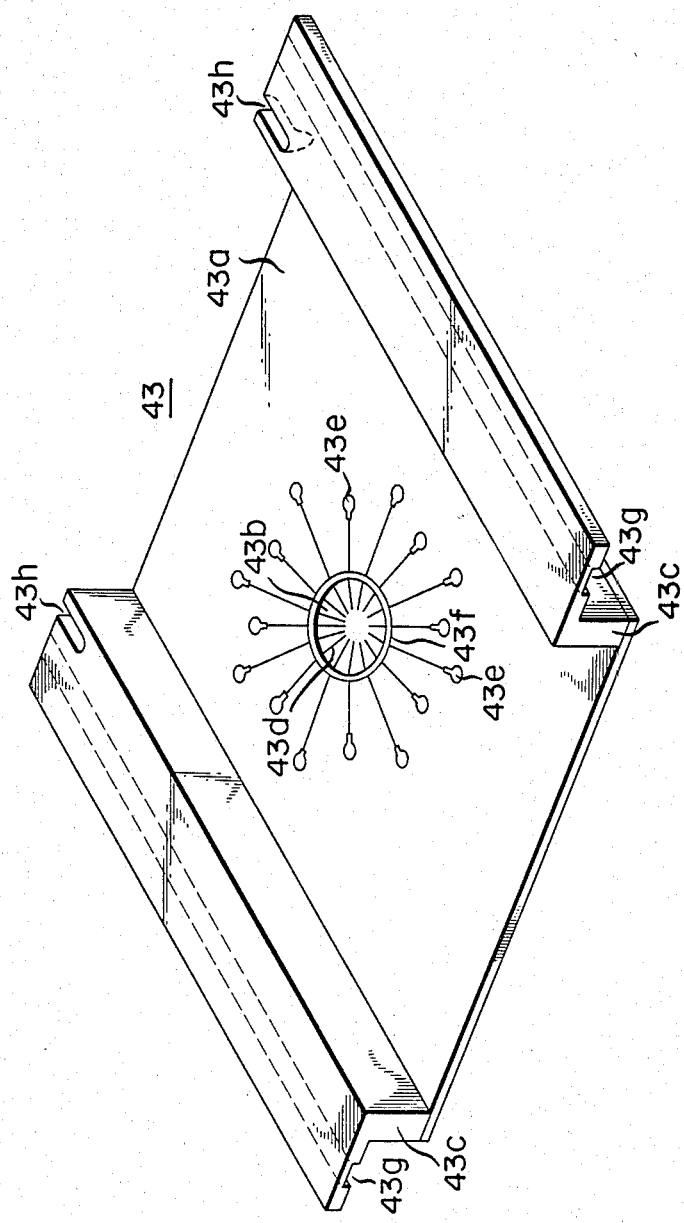
FIG. 10 schematically shows a probe card unit for testing wafers according to the invention.

FIG. 10 shows an example of probe card unit 43 used in this invention. Electrical terminals 43e to be in contact with contact pins 61 are formed on probe card 43a so as to surround hole 43b thereof. The probes 43d connected to the terminals 43e are supported on the periphery of hole 43b by a reinforcing member 43f. The probe card 43a is screwed at both ends thereof to the lower portions of L-shaped spacers or support members 43c. Each of support members 43 has a guide groove 43g on the under surface thereof for ease of insertion into fixing mechanism 42, and a positioning groove 43h at one end portion.

Figure 11:
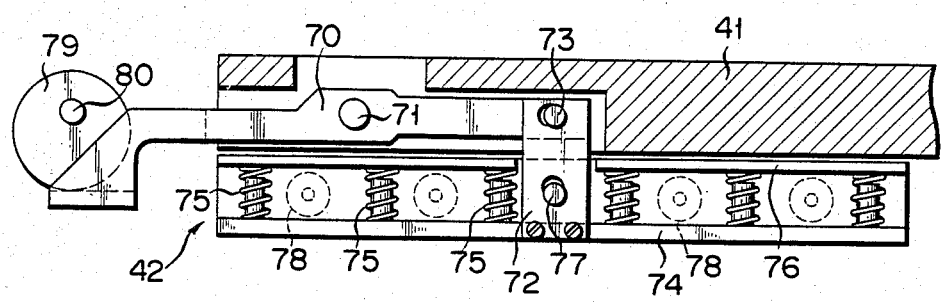
FIGS. 11 to 13 show a probe card unit fixing mechanism.
Figure 12:
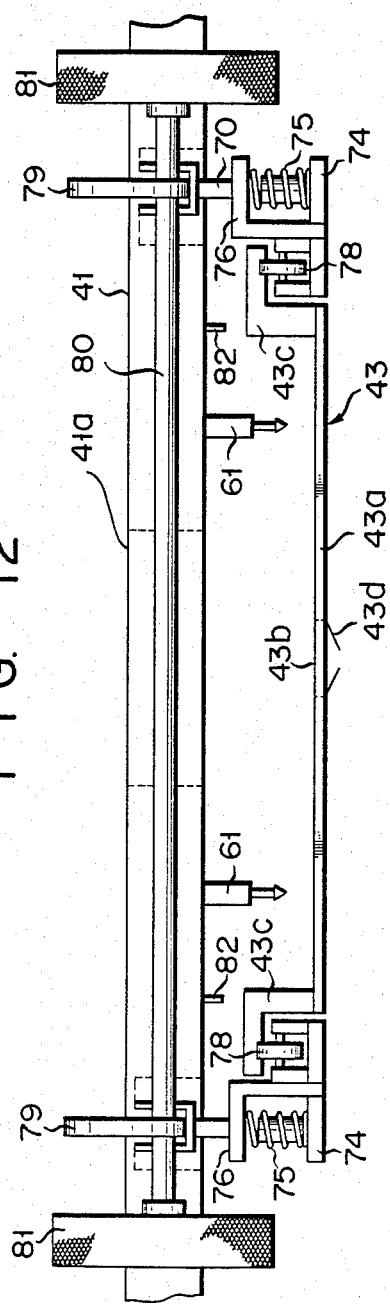
Figure 13:
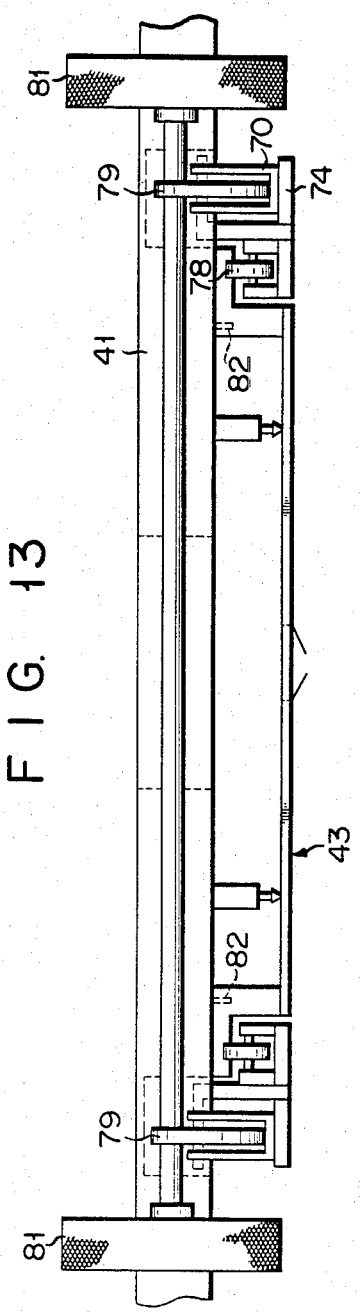

Referring now to FIGS. 11 to 13, the fixing mechanism 42 for probe card unit 43 will be described. As shown in FIG. 11, a lever 70 is rockably mounted to fixed table 41 by means of a pin 71. A support plate 72 is rockably mounted at its upper end portion at one end of lever 70 by means of a pin 73. A movable plate 74 is fixed to the lower end portion of support plate 72. A plurality of spring members 75 are arranged on movable plate 74. An L-shaped support member 76 is vertically movably attached to support plate 72 by means of a pin 77 so as to lie on spring members 75. A plurality of guide rollers 78 are mounted on that side of L-shaped support member 76 which supports probe card unit 43. The other end portion of lever 70 is so shaped as to engage an eccentric cam 79 which is mounted on a shaft 80. Thus, the fixing mechanism 42 is so constructed that movable plate 74 and probe card support member 76 can move up and down as eccentric cam 79 rotates. As shown in FIGS. 12 and 13, the fixing mechanism 42 is so constructed as to hold both end portions of probe card unit 43.

As shown in FIGS. 12 and 13, a knob 81 is fixed to each end of shaft 80 on which is mounted eccentric cam 79. Reference numeral 82 designates positioning pins which are attached to the under surface of fixed table 41 and are fitted individually in positioning grooves 43h of spacers 43c of probe card unit 43 when probe card unit 43 is clamped.

There will now be described the operation by which probe card unit 43 is inserted and clamped. First, knobs 81 are turned to rotate eccentric cams 79, thereby lowering movable plates 74 and support members 76, as shown in FIG. 12. In this state, probe card unit 43 is inserted into specimen chamber 31 so that the guide grooves 43g of spacers 43c slide on guide rollers 78. If the knobs 81 are turned reversely after the probe card unit 43 is inserted to the predetermined position, then the movable plates 74 and the support members 76 are moved up to elevate the probe card unit 43, as shown in FIG. 13. Thereupon, the positioning pins 82 are fitted in the positioning grooves 43h of probe card unit 43 to accurately position probe card unit 43. The probe card unit 43 is clamped to fixed table 41 by the urging force of springs 75 provided on movable plate 74. In this state, the knobs 81 are locked by a lock mechanism (not shown). The probe card unit 43 may be removed by inversely following the aforesaid steps of operation.

The probe card unit described above is used for testing wafers. However, testing of packaged IC's can be easily performed using a probe card unit which has basically the same construction as that of the probe card unit 43 for wafers by virtue of the construction in which the spring contact pins are attached to the fixed table.

Figure 14:
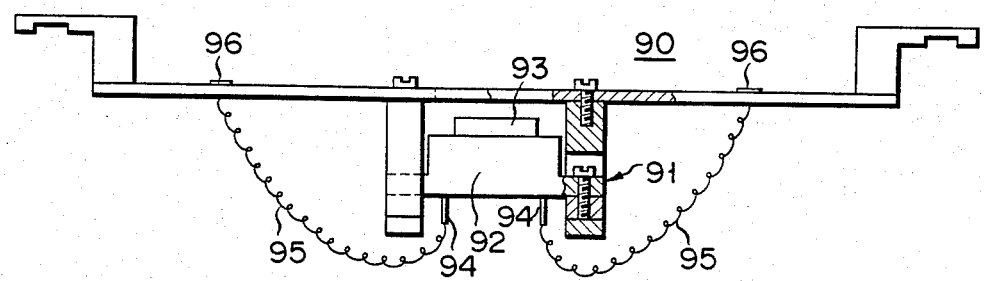
FIGS. 14 and 15 show a probe card unit for testing packaged IC.
Figure 15:
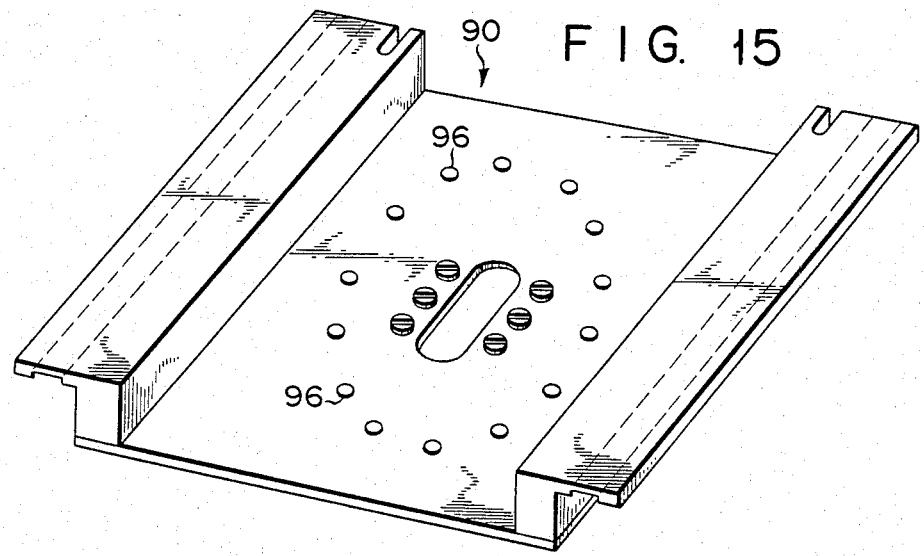

Namely, a probe card unit 90 as shown in FIGS. 14 and 15 may be used for testing packaged IC's. The probe card unit 90 is provided on its undersurface with a support mechanism 91 which supports a socket 92 for holding an open-packaged IC 93. Input and output terminals 94 of socket 92 are connected by means of lead wires 95 to terminals 96 which are arranged on the top surface of probe card unit 90 in a positional relation corresponding to that of spring contact pins 61 on fixed table 41. It will therefore be evident that, by the use of the probe card unit of such construction, openpackaged IC's can readily be tested in the same manner as in the case of testing wafers. Although the socket 92 is disposed under the probe card unit 90 in the example shown in FIG. 14, it may be located on the probe card unit 90.

This invention is not limited to the embodiments described above, and various changes and modifications may be effected by one skilled in the art without departing from the scope or spirit of the invention. The table drive motors need not all be disposed outside the specimen chamber. For example, only those motors which are located so close to the electron beam as to have an influence thereon may be arranged outside of the specimen chamber. Moreover, the construction of the fixing mechanism, the shape of the probe card unit, and the number of the spring contact pins have been described herein by way of illustration only, and this invention is not limited to those precise arrangements.

What we claim is:

1. An integrated circuit tester using an electron beam, comprising:

a specimen chamber provided with a Z table and an X-Y table for holding a probe card unit to make electrical contact between electrical terminals of a specimen placed in said specimen chamber and lead wires led outside of said specimen chamber;

an electron optical column disposed on said specimen chamber for radiating an electron beam to said specimen;

a table drive system for driving said Z table in the direction of electron beam radiation and said X-Y table in X- and Y-directions in a plane perpendicular to the direction of electron beam radiation;

said probe card unit comprising a plurality of electrical terminals which are arranged in a predetermined position relation on a top surface thereof to be connected to said electrical terminals of said specimen;

said Z table including a fixed table provided with a plurality of downwardly protruding spring contact pins which are connected to said lead wires led outside of said specimen chamber and arranged in the same position relation as that of said electrical terminals on said probe card unit; and a probe card unit fixing mechanism attached to the undersurface of said fixed table and so arranged to allow said probe card unit to slide laterally along the undersurface of said fixed table and to move upward after the probe card unit reaches a predetermined lateral position, whereby the upward movement of said probe card unit results in the probe card unit being pressed against the undersurface of said fixed table and said spring contact pins being brought into electrical contact with their corresponding electrical terminals on the top surface of said probe card unit.

2. The integrated circuit tester according to claim 1, wherein said specimen is a wafer placed on said X-Y table, and said probe card unit has probes to be in contact with electrical terminals of said wafer, said probes being connected to said electrical terminals on said top surface of said probe card unit.

3. The integrated circuit tester according to claim 1, wherein said specimen is a packaged integrated circuit, and said probe card unit has a socket for the packaged integrated circuit, terminals of said socket being connected to said electrical terminals on said top surface of said probe card unit.

4. The integrated circuit tester according to claim 1, wherein said fixing mechanism includes guide rollers enabling said probe card unit to be carried along said undersurface of said fixed table, and manual operating means for vertically moving said probe card unit.

5. The integrated circuit tester according to claim 4, wherein said probe card unit has guide grooves to engage said guide rollers.

6. The integrated circuit tester according to claim 1, wherein positioning pins are formed on said undersurface of said fixed table, and said probe card unit is provided with positioning grooves to engage said positioning pins.

7. The integrated circuit tester according to claim 1, wherein said specimen chamber is provided with a door through which said specimen and said probe card unit are removed for replacement.

8. The integrated circuit tester according to claim 1, wherein said probe card unit includes a probe card portion and a spacer portion fitted on the undersurface thereof with said probe card portion, whereby a fixed distance is kept between the undersurface of said fixed table and said probe card portion when said probe card unit is clamped to said undersurface of said fixed table.

9. The integrated circuit tester according to claim 1, wherein at least part of said table drive system for driving said Z table and said X-Y table is located outside of said specimen chamber.

10. The integrated circuit tester according to claim 1, wherein said fixing mechanism includes guide means for guiding lateral movement of said probe card unit along said undersurface of said fixed table.

11. The integrated circuit tester according to claim 10, wherein said guide means comprises:
    guide rollers enabling said probe card unit to be carried along said undersurface of said fixed table.

12. The integrated circuit tester according to claim 11, wherein said guide means comprises:
    guide grooves to engage said guide rollers.

* * * * *